(12) United States Patent
Beerens et al.

(10) Patent No.: US 9,182,683 B2
(45) Date of Patent: Nov. 10, 2015

(54) LITHOGRAPHIC APPARATUS AND LITHOGRAPHIC PROJECTION METHOD

(75) Inventors: Ruud Antonius Catharina Maria Beerens, Roggel (NL); Antonius Franciscus Johannes De Groot, Someren (NL)

(73) Assignee: ASML NETHERLANDS B.V., Veldhoven (NL)

( * ) Notice: Subject to any disclaimer, the term of this patent is extended or adjusted under 35 U.S.C. 154(b) by 715 days.

(21) Appl. No.: 13/401,597

(22) Filed: Feb. 21, 2012

(65) Prior Publication Data
US 2012/0212715 A1    Aug. 23, 2012

Related U.S. Application Data

(60) Provisional application No. 61/445,428, filed on Feb. 22, 2011.

(51) Int. Cl.
| | | |
|---|---|---|
| G03B 27/44 | (2006.01) |
| G03B 27/42 | (2006.01) |
| G03B 27/62 | (2006.01) |
| G03B 27/32 | (2006.01) |
| G03F 7/20 | (2006.01) |

(52) U.S. Cl.
CPC .................. *G03F 7/70691* (2013.01)

(58) Field of Classification Search
CPC ............ G03F 7/70691; G03F 7/70716; G03F 7/70725; G03F 7/70758; G03F 7/70766
USPC ........... 355/46, 52, 53, 55, 67–77; 250/492.1, 250/492.2, 492.22, 493.1, 548; 430/5, 8, 430/22, 30, 311, 312, 321
See application file for complete search history.

(56) References Cited

U.S. PATENT DOCUMENTS

| | | | | |
|---|---|---|---|---|
| 4,814,830 A | * | 3/1989 | Isohata et al. .................... 355/54 |
| 4,982,227 A | * | 1/1991 | Suzuki ............................ 355/53 |
| 5,859,690 A | * | 1/1999 | Toguchi ........................... 355/53 |

(Continued)

FOREIGN PATENT DOCUMENTS

| | | |
|---|---|---|
| CN | 1873542 | 12/2006 |
| CN | 101533228 | 9/2009 |

(Continued)

OTHER PUBLICATIONS

English translation of KR 2008010656, published on Jan. 31, 2008.*

*Primary Examiner* — Christina Riddle
(74) *Attorney, Agent, or Firm* — Pillsbury Winthrop Shaw Pittman LLP

(57) ABSTRACT

A lithographic apparatus, includes an illumination system configured to condition a radiation beam, a first support constructed to support a first patterning device and a second support to support a second patterning device, the first and second patterning device being capable of imparting the radiation beam with a pattern in its cross-section to form a patterned radiation beam, a substrate table constructed to hold a substrate, and a projection system configured to project the patterned radiation beam onto a target portion of the substrate. The first support and second support are movable in a scanning direction and in a second direction substantially perpendicular to the scanning direction. By movement of the first support and second support in the second direction the first support and second support can selectively be aligned with the projection system.

18 Claims, 5 Drawing Sheets

(56) References Cited

U.S. PATENT DOCUMENTS

| | | | |
|---|---|---|---|
| 5,969,441 A * | 10/1999 | Loopstra et al. | 310/12.06 |
| 6,327,022 B1 * | 12/2001 | Nishi | 355/53 |
| 6,940,582 B1 | 9/2005 | Tanaka | |
| 7,714,982 B2 * | 5/2010 | Nagasaka | 355/53 |
| 8,330,936 B2 | 12/2012 | Streefkerk et al. | |
| 8,582,082 B2 | 11/2013 | Staals et al. | |
| 2001/0006762 A1 * | 7/2001 | Kwan et al. | 430/311 |
| 2002/0123012 A1 * | 9/2002 | Sewell | 430/397 |
| 2003/0142284 A1 * | 7/2003 | Lin | 355/77 |
| 2003/0198787 A1 * | 10/2003 | Kwan | 428/195.1 |
| 2004/0004700 A1 | 1/2004 | Park et al. | |
| 2007/0013894 A1 * | 1/2007 | Loopstra | 355/72 |
| 2007/0273854 A1 * | 11/2007 | Nagasaka | 355/46 |
| 2008/0068570 A1 | 3/2008 | Streefkerk et al. | |
| 2009/0153819 A1 * | 6/2009 | Okita | 355/53 |
| 2009/0231563 A1 | 9/2009 | Staals et al. | |
| 2010/0033698 A1 | 2/2010 | Sewell | |

FOREIGN PATENT DOCUMENTS

| | | |
|---|---|---|
| CN | 101644901 | 2/2010 |
| CN | 201583783 | 9/2010 |
| JP | 11-176743 | 7/1999 |
| JP | 2000-021715 | 1/2000 |
| JP | 2008-078648 | 4/2008 |
| JP | 2010-141035 | 6/2010 |
| JP | 2011-164430 | 8/2011 |
| KR | 2008010656 A * | 1/2008 |

* cited by examiner

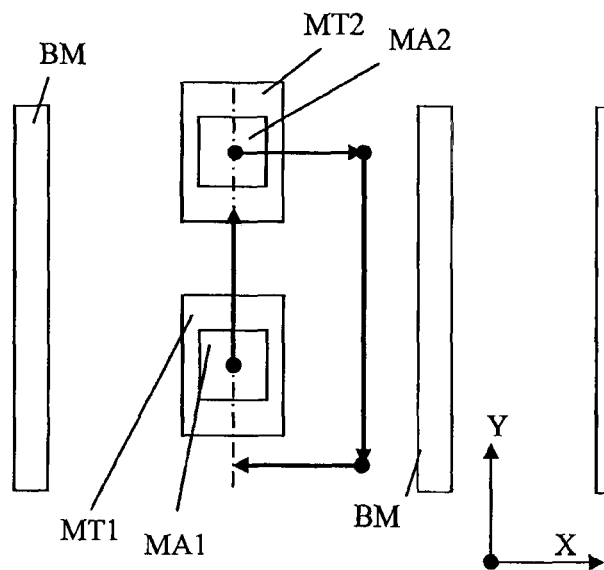
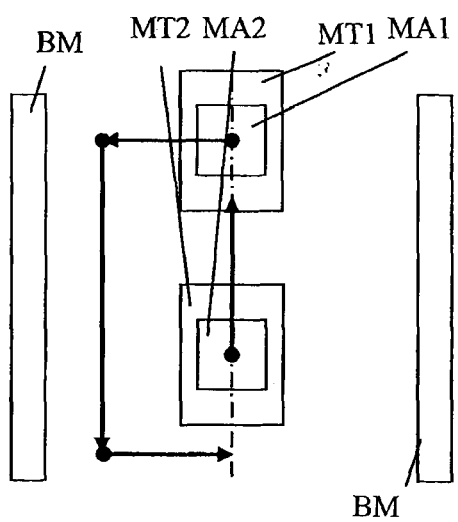
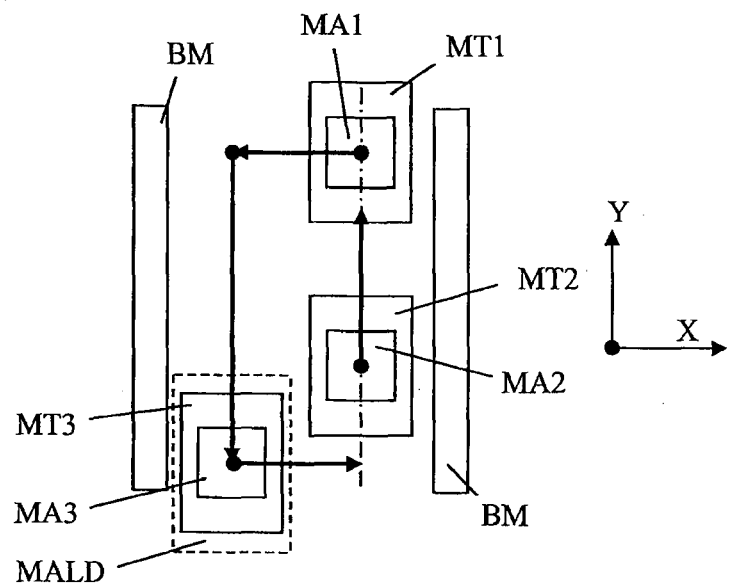

LITHOGRAPHIC APPARATUS AND LITHOGRAPHIC PROJECTION METHOD

CROSS REFERENCE TO RELATED APPLICATIONS

This application claims priority and benefit under 35 U.S.C. §119(e) to U.S. Provisional Patent Application No. 61/445,428, entitled "Lithographic Apparatus and Lithographic Projection Method," filed on Feb. 22, 2011. The content of that application is incorporated herein in its entirety by reference.

FIELD

The present invention relates to a lithographic apparatus, and a lithographic projection method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to make use of a lithographic apparatus as efficiently as possible, it is desirable to achieve a high throughput of the lithographic apparatus, so that a large amount of substrates can be processed by the lithographic apparatus in the shortest possible time.

In a scanning mode of a scanning-type lithographic apparatus, the substrate table is moved with a substrate table scanning movement, i.e. a movement with a substantially constant speed, across a projection system. At the same time as the scanning movement of the substrate table, a support supporting a patterning device is scanned also with a scanning movement, i.e. a movement with substantially constant speed across the projection system to impart a pattern in a radiation beam of the lithographic apparatus. Since during projection the support of the patterning device is moved from a starting position to an end position, the patterning device support has to be moved back to the start position before the patterning device support is ready for a new scanning movement in the same direction.

Therefore, the lithographic apparatus may be configured to make a meandering pattern of substrate table scanning movements over the substrate. The subsequent scanning movements of the patterning device support may then be in opposite directions, since the direction of the subsequent substrate scanning movements is also in opposite directions. For each substrate table scanning movement, the substrate table has to be decelerated and accelerated to obtain the desired speed and direction. Such deceleration and acceleration to a substantially constant speed takes considerable time.

In an alternative scanning trajectory, a substrate table scanning movement is made across multiple dies arranged in a row or column on the substrate, for example over the length of the substrate, while the patterned radiation beam is only projected on a part of the dies. For example, during a single substrate table scanning movement the patterned radiation beam is projected only on the dies at uneven locations of the row or column of dies. The time required for passing the dies at even locations is used to bring the patterning device support back from the end position to the start position.

SUMMARY

It is desirable to provide a lithographic apparatus and a lithographic projection method with the possibility of an efficient pattern of substrate table scanning movements over the substrate.

According to an embodiment of the invention, there is provided a lithographic apparatus comprising: an illumination system configured to condition a radiation beam; a first support constructed to support a first patterning device and a second support constructed to support a second patterning device, the first patterning device and second patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the first support and second support are movable in a scanning direction over a scanning distance of at least a length of the first patterning device or second patterning device in the scanning direction, wherein the first support and second support are movable in a second direction substantially perpendicular to the scanning direction over a distance of at least a width of the first patterning device or second patterning device in the second direction, and wherein the lithographic apparatus is constructed to selectively align the first support or second support with the projection system by movement of the first support and/or second support in the second direction.

According to an embodiment of the invention, there is provided a lithographic projection method using a scanning-type lithographic apparatus comprising a first support supporting a first patterning device and a second support supporting a second patterning device, comprising: performing a substrate table scanning movement with the substrate table such that dies arranged in a row or column of the substrate supported on the substrate table are subsequently aligned with the projection system, selectively aligning the first support and the second support with the projection system, performing a scanning movement with the first or second support aligned with the projection system during the substrate table scanning movement to impart the radiation beam with a pattern in its cross section of the first patterning device or the second patterning device, respectively, and projecting the patterned radiation beam on the dies of the substrate subsequently aligned with the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6a and 6b show movements of an alternative combination of a first and second patterning device support according to an embodiment of the invention; and FIG. 7 shows movements of a combination of first, second and third patterning device support according to an embodiment of the invention;

DETAILED DESCRIPTION

Figure 1:
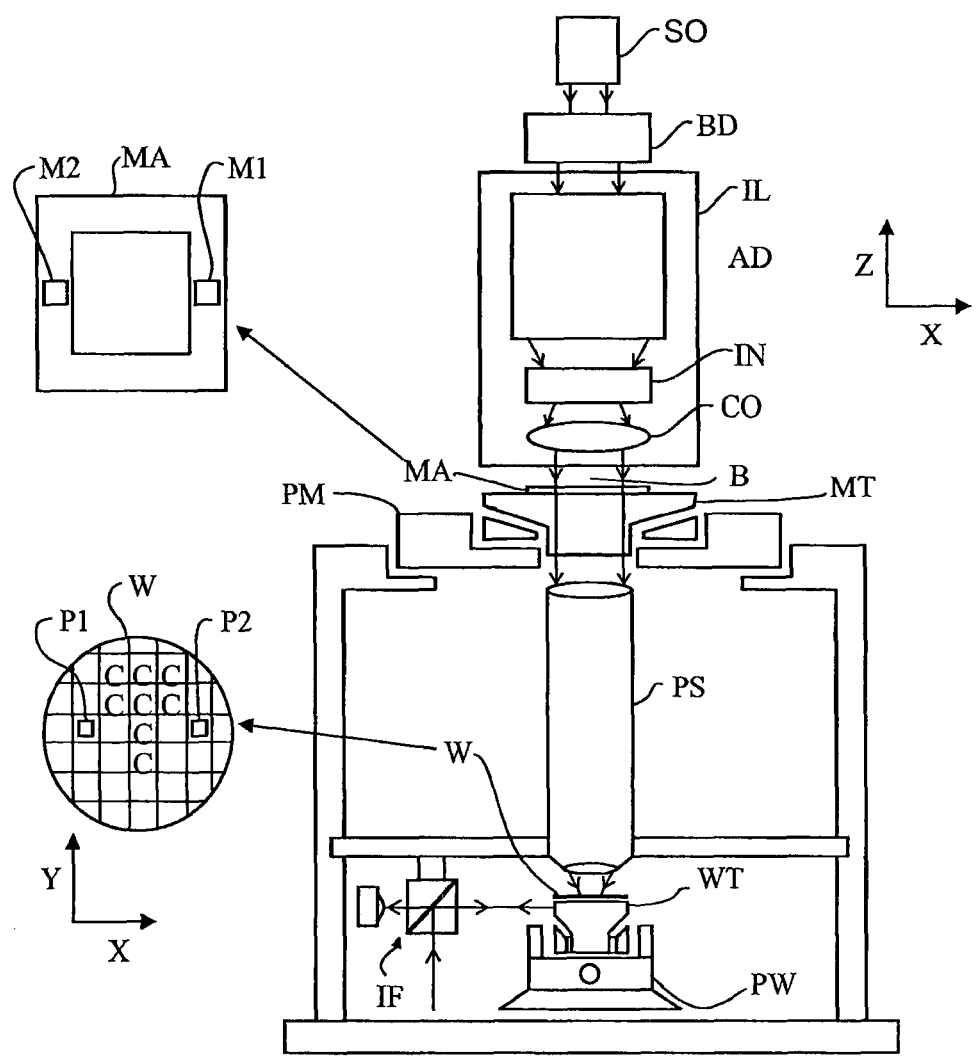
FIG. 1 depicts a prior art lithographic apparatus.

FIG. 1 schematically depicts a lithographic apparatus. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables or "substrate supports". In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support MT (e.g., mask table), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the mask table may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:
1. In step mode, the patterning device support MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a scanning mode of the lithographic apparatus, the substrate table WT is moved with a substrate table scanning movement, i.e. a movement with a substantially constant speed in a scanning direction (in this case y-direction), across a projection system. During the substrate table scanning movement of the substrate table WT, a support MT supporting a patterning device MA is scanned also with a scanning movement, i.e. a movement with substantially constant speed across the projection system PS to impart a pattern in a radiation beam B of the lithographic apparatus. This scanning movement is also made in a scanning direction.

In the lithographic apparatus shown in FIG. 1 the substrate table scanning movement and the scanning movement of the patterning device support are opposite, i.e. in positive and negative y-direction. In an alternative embodiment, the movements may be parallel; i.e. both in positive or negative y-direction.

During projection of this patterned radiation beam B, the support MT of the patterning device MA is moved from a starting position to an end position. To make a subsequent projection of the patterned radiation beam B on the substrate W possible during the same substrate table scanning movement, the patterning device support MT has to be moved back to the start position before the patterning device support MT is ready for a new scanning movement in the same direction.

Therefore, the lithographic apparatus may be configured to make a meandering pattern of substrate table scanning movements over the substrate. The subsequent scanning movements of the patterning device support may then be in opposite directions, since the direction of the subsequent substrate scanning movements is also in opposite directions. However, for each substrate table scanning movement, the substrate table has to be decelerated and accelerated to obtain the desired speed and direction. Such deceleration and acceleration to a substantially constant speed takes considerable time.

In an alternative scanning trajectory, a substrate table scanning movement is made across multiple dies arranged in a row or column on the substrate, for example over the length of the substrate, while the patterned radiation beam is only projected on a part of the dies; for example, the patterned radiation beam is projected on the dies at uneven locations of the row or column of dies. The time required for passing the dies at even locations is used to bring the patterning device support back from the end position to the start position.

Figure 2:
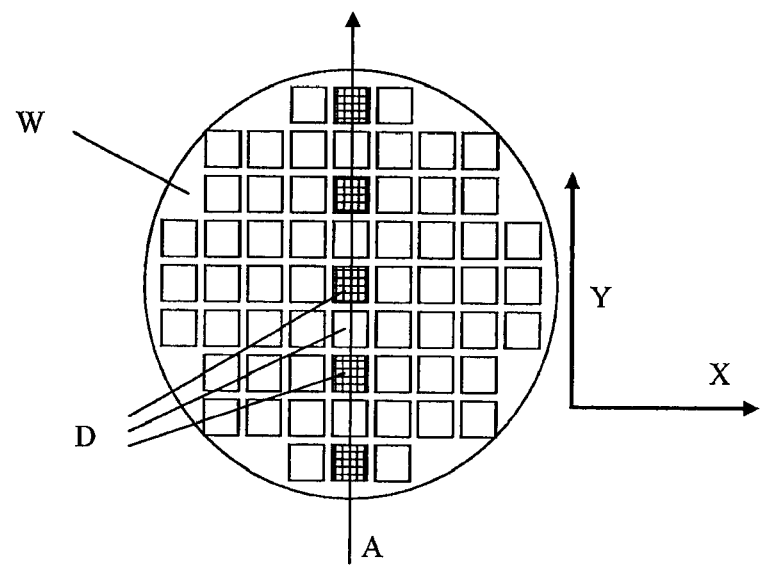
FIG. 2 shows a prior art scanning trajectory in a lithographic apparatus.

This alternative scanning trajectory is shown, as an example, in FIG. 2. The substrate W is moved with a substrate table scanning movement indicated by the arrow A, across the projection system. During this substrate table scanning movement the patterned radiation beam is projected on the dies D at uneven locations in the row of dies D in Y-direction. During each projection on a die D, the patterning device support MT is moved with a scanning movement from a start position to an end position. The period of time that a die at an even location passes the projection system is used to bring the patterning device support MT back from the end position to the start position, so that the patterning device support MT is ready for a new scanning movement to project a patterned radiation beam B on the next die at an uneven location of the substrate W. To project a patterned radiation beam on all of the dies of the substrate W, the substrate W has to be moved again with a substrate table scanning movement A across the projection system to project the patterned radiation beam on all dies at even locations of the row. In this substrate table scanning movement the time wherein a die at an uneven location passes the projection system, is used to bring the patterning device support MT from the end position back to the start position. Thus, in this scanning trajectory all dies have to be moved twice across the projection system to project the patterned radiation beam, which also takes considerable time.

Figure 3:
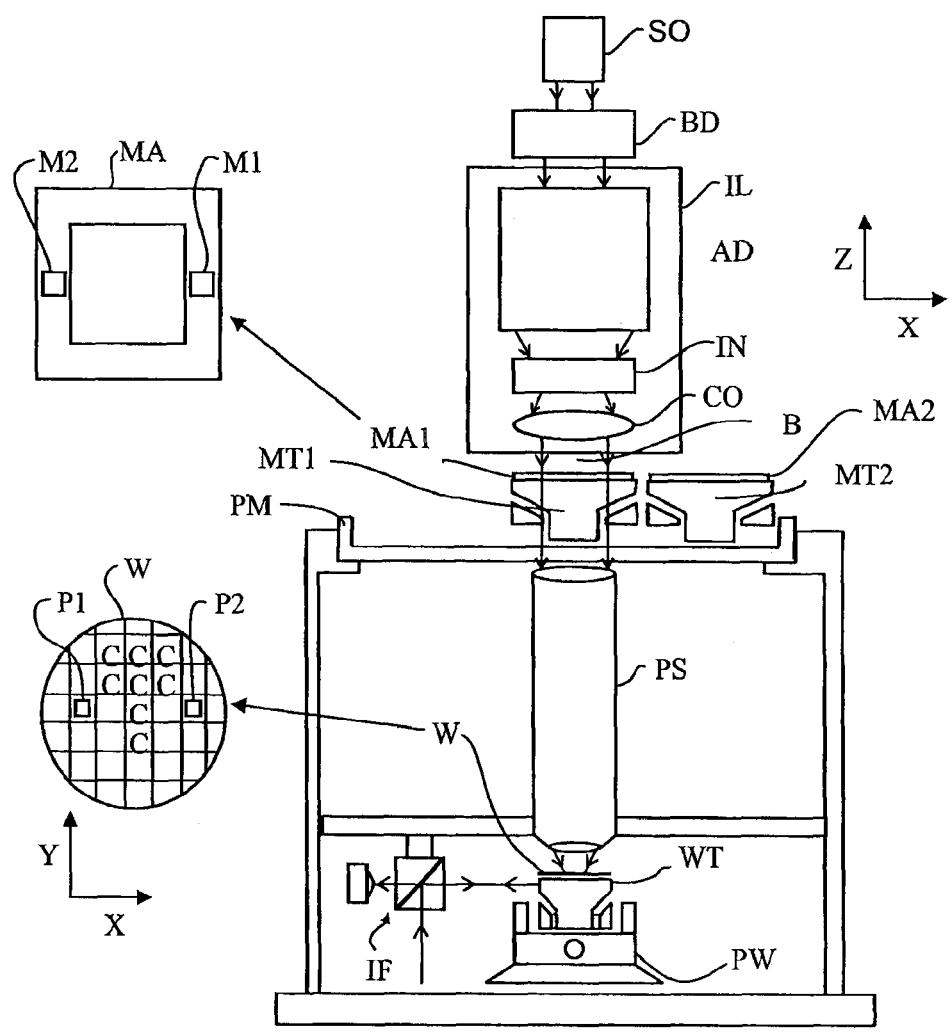
FIG. 3 depicts a lithographic apparatus according to an embodiment of the invention.

FIG. 3 shows a lithographic apparatus according to an embodiment of the invention. The same parts or parts having substantially the same function are indicated by the same reference numerals as the embodiment of FIG. 1. Unless indicated otherwise, the lithographic apparatus may be constructed and function similarly to the above-described lithographic apparatus of FIG. 1.

The lithographic apparatus of FIG. 3 comprises two patterning device supports; a first support MT1 constructed to support a first patterning device MA1 and a second support MT2 constructed to support a second patterning device MA2. The first support MT1 and second support MT2 are both movable in a scanning direction, the y-direction, over a scanning distance of at least a length of the patterning device MA1, MA2 in the scanning direction.

In FIG. 3, the first support MT1 is aligned with the projection system PS, i.e. during a scanning movement of the first support MT1 in the scanning direction the radiation beam B can be imparted with a pattern of the first pattern device MA1. When desired also the second patterning device MA2 may be aligned with the projection system PS so that the projection beam B can be imparted with a pattern of the second patterning device during a scanning movement of the second support MT2.

To selectively align the first support MT1 and second support MT2 with the projection system PS, the first support MT1 and second support MT2 are movable in a second direction, the x-direction, substantially perpendicular to the scanning direction, the y-direction, over a second distance of at least a width of the patterning device MA1, MA2 in the second direction. The lithographic apparatus comprises a single actuator, set of actuators and/or actuator body PM to move the first support MT and the second support MT2 simultaneously in the x-direction.

When one of the supports MT1, MT2 is aligned with the projection system PS to make a scanning movement from a start position to an end position, the other of the supports MT2, MT1, can be moved back, in the y-direction, from the end position to the start position. As a result, at the end of the projection of a patterned radiation beam B on a die with the first support MT1, the second support MT2 is ready to start a scanning movement for projection of the patterned radiation beam on a subsequent die, but not yet aligned with the projection system PS.

To project a patterned radiation beam B on a subsequent die, the second support MT2 only has to be aligned with the projection system PS by a movement in the x-direction of the first support MT1 and the second support MT2. This movement in x-direction may possibly be carried out as a relative coarse movement since the position of the substrate table WT may be controlled very accurately in six degrees of freedom. As a result, a patterned radiation beam can be projected on two adjacent dies during a single substrate table scanning movement.

FIGS. 4a-4d shows the movements of the first support MT1 and the second support MT2 during subsequent projection of a patterned radiation beam B on adjacent dies in more detail.

Figure 4A:
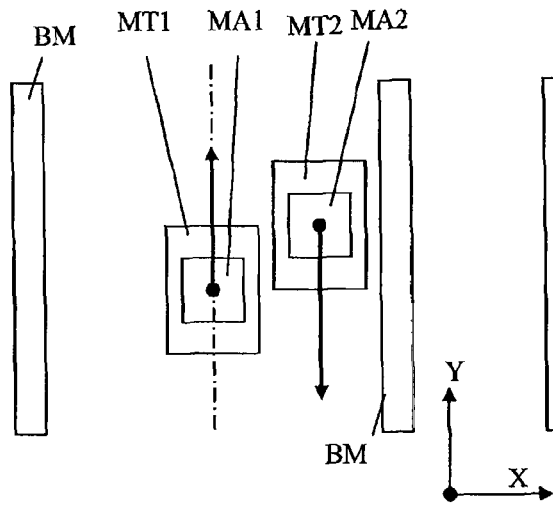
FIGS. 4a-4d show movements of a combination of a first and second patterning device support according to an embodiment of the invention.

FIG. 4a shows, similar to FIG. 3, the first support MT1 in the start position of the scanning movement, and aligned with the projection system PS, i.e. in the middle between the balance masses BM of the first support MT1 and second support MT2. An arrow in the positive y-direction indicates the scanning movement of the support MT1. The second support MT2 is positioned, in y-direction, in the end position of a scanning movement. The second support MT2 is not aligned with the projection system, i.e. when a scanning movement is made in the y-direction it will not move along the optical axis of the projection system to receive a radiation beam. During the scanning movement of the first support MT1, the second support MT2 may be moved back from the end position to the start position, as indicated by an arrow.

Figure 4B:
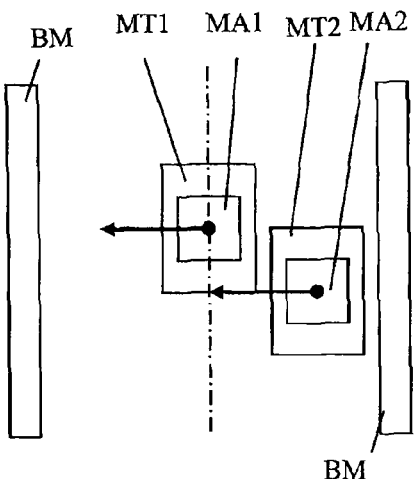

FIG. 4b shows the first support MT1 and the second support MT2 after the movements indicated by arrows in FIG. 4a. The first support MT1 is now positioned in the end position of the scanning movement. The second support MT2 is moved back to the start position in y-direction, but is not aligned, in x-direction, with the projection system PS. To align the second support MT2 with the projection system to perform a subsequent scanning movement, for instance during the same substrate table scanning movement, the first support MT1 and the second support MT2 are simultaneously moved in the negative x-direction as indicated by arrows.

Figure 4C:
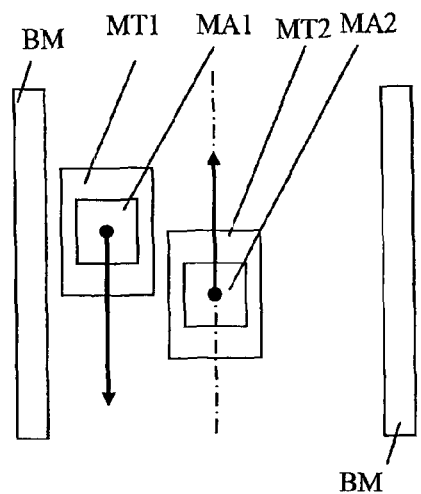

FIG. 4c shows the first support MT1 and the second support MT2 after this movement in the x-direction. The second support MT2 is now aligned with the projection system PS and positioned in the start position ready to perform a scanning movement indicated by an arrow. During this scanning movement of the second support MT2, the first support MT1 can now be moved from the end position back to the start position to again perform a scanning movement after the scanning movement of the second support MT2. This movement is also indicated by an arrow in FIG. 4c. During this movement of the first support MT1, it is not aligned with the projection system PS.

Figure 4D:
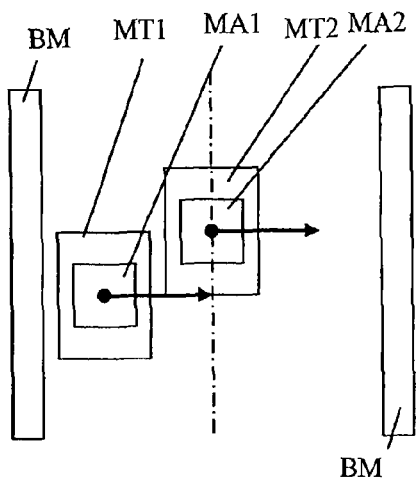

FIG. 4d shows the positions of the first support MT1 and the second support MT2 after these movements. The second support MT2 is still aligned with the projection system PS, but now in the end position of the scanning movement, and the first support MT1 is not aligned with the projection system PS, but is positioned, in y-direction, at the start position of a scanning movement.

By simultaneous movement of the first support MT1 and the second support MT2 in the positive x-direction, the first support MT1 can be aligned with the projection system to carry out a new scanning movement and the second support MT2 can be brought into a position where it can be moved back to the start position of the scanning movement without interfering the scanning movement of the first support MT1. After this simultaneous movement of the first support MT1 and the second support MT2 in the positive x-direction, as indicated by arrows, the first support MT1 and the second support MT2 have the same position as shown in FIG. 4a, and the above-described movements can be carried out for projection of a pattern on each of a row of adjacent dies within a single substrate table scanning movement.

Figure 5:
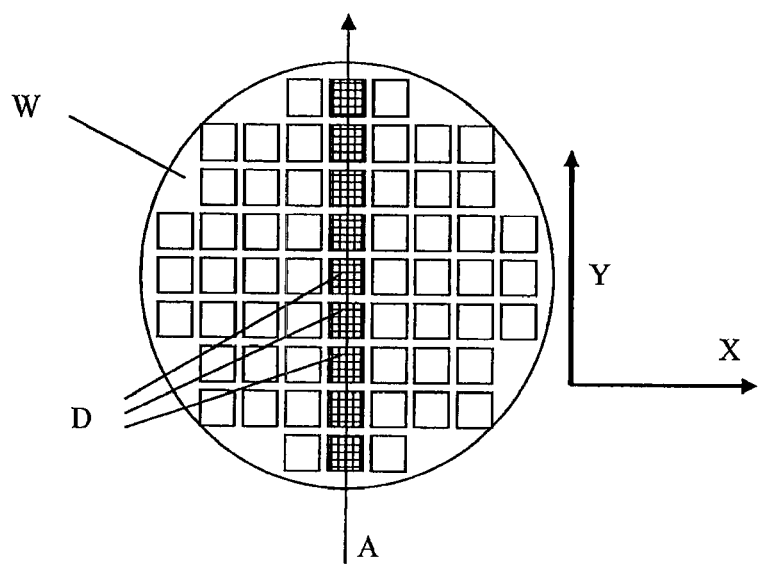
FIG. 5 shows a scanning trajectory with a lithographic apparatus according to an embodiment of the invention.

FIG. 5 shows such single substrate table scanning movement A of the substrate W. The first patterning device MA1 supported on the first support MT1 and the second patterning device MA2 supported on the second support MT2 can alternately be used for projection of a patterned radiation beam on a row of adjacent dies D. For example, the first patterning device MA1 is used for the dies at uneven locations and the second patterning device MA2 is used for the dies at even locations. Thus, all the dies in a single row can be projected in a single substrate table scanning movement of the substrate table. This results in a very efficient use of a lithographic apparatus without the need of the provision of a second illumination system and/or a second projection system.

It is remarked that the die exposure method and trajectory as shown in FIG. 2, or any other suitable die exposure method and trajectory, may also be carried out with the lithographic apparatus according to the invention.

The first patterning device MA1 and the second patterning device MA2 have substantially the same pattern to project substantially the same pattern on all dies of a row of dies D on a substrate W, or even all dies D of a substrate W. However, it may also be possible that the first patterning device and the second patterning device have different patterns, for instance to perform a double patterning process.

FIGS. 6a and 6b show an alternative embodiment of a combination of a first support MT1 and a second support MT2. In this embodiment, each of the first support MT1 and a second support MT2 comprises its own actuator, set of actuators and/or actuator body to move the respective support MT1, MT2 in the second direction, i.e. the x-direction. Such embodiment has the benefit that the movement of the second support MT2 from the end position of the scanning movement to the start position of a new scanning movement can be made independently of the scanning movement of the first support MT1, and vice versa. In contrast, the movement of the second support MT2 in the x-direction in the embodiment of FIGS. 4a-4d can only be started after the end of the scanning movement of the first support MT1, since the first support MT1 and the second support MT2 are simultaneously moved in the x-direction.

In FIG. 6a it is shown that during the scanning movement of the first support MT1 indicated by an arrow in the y-direction, the second support MT2 can be moved from the end position to the start position of scanning movement by subsequent movements of the second support MT2 in the positive x-direction, the negative y-direction and the negative x-direction (also indicated by arrows). When the scanning movement of the first support MT1 is finished, the scanning movement of the second support can directly be started, or even already be started.

As shown in FIG. 6b, during the scanning movement of the second support MT2, the first support MT1 may be brought back from the end position to the start position by subsequent movements of the first support MT1 in the negative x-direction, the negative y-direction and the positive x-direction. In this way the first support MT1 and the second support MT2 can be moved independently in loops about each other so that adjacent dies on a substrate W can be projected with a patterned radiation beam during a single scanning movement of the substrate table WT supporting the substrate W.

In FIGS. 6a and 6b the first support MT1 and the second support MT2 each move through a loop at one side of the lithographic apparatus. This has the benefit that for each support MT1, MT2 a separate cable connection, for instance cable schlep can be used which is connected to the respective free side of the support MT1, MT2. any other movement or trajectory may also be applied.

FIG. 7 shows another support combination of an embodiment of the invention comprising multiple supports constructed to support patterning devices. In this combination, a first support MT1 a second support MT2 and a third support MT3 are provided to support a first patterning device MA1, a second patterning device MA2, and a third patterning device MA3, respectively. In this embodiment, all supports MT1, MT2, MT3 follow the same route. A scanning movement is performed in the positive y-direction from a start position to an end position. During this scanning movement the respective support MT1, MT2, MT3 is aligned with the projection system so that a projection beam to be projected on a die can be imparted with a pattern of the patterning device MA1, MA2, MA3 supported on the respective support MT1, MT2, MT3. After the scanning movement the support MT1, MT2, MT3 can be brought back to the start position with subsequent movements in the negative x-direction, the negative y-direction and the positive x-direction.

Since there are more than two supports MT1, MT2, MT3 available, the complete loop movement from the end position to the start position has not to be made within the time of a single scanning movement of one support. In the embodiment of FIG. 7 after the scanning movement of the first support MT1, the third support MT3 may perform a scanning movement. Only after the end of the scanning movement of the third support MT3, the second support MT2 has to be ready to perform a scanning movement.

It is remarked that is it not required that all supports MT1, MT2, MT3 follow the same route. The supports MT1, MT2, MT3 may follow different routes, and, when desired, these routes may change. Also, when desired, more than three support may be provided.

The lithographic apparatus of FIG. 7 comprises a patterning device loading device MALD for loading and unloading of a patterning device on the supports MT1, MT2, MT3. In FIG. 7, the third support MT is positioned in a loading/unloading position wherein the patterning device MA3 can be unloaded from the support MT3, and a new patterning device can be loaded on the support MT3. During the loop movement of the first support MT1 and the second support MT2, the first support MT1 and the second support MT2 may also pass this loading/unloading position. The position loading/unloading position may also be reached by leaving the loop movement.

The patterning device loading device MALD is positioned such that loading/unloading of a patterning device on the respective support MT1, MT2, MT3, can be carried out when another of the supports MT1, MT2, MT3 is aligned with the illumination device to receive the projection beam, i.e. during performing the scanning movement.

Such patterning device loading device MALD may also be provided in any other embodiment of the invention, such as for instance shown in FIGS. 3, 4a-4d, and 6a and 6b.

In the embodiments of FIGS. 4a-4d, 6a, 6b and 7 balance masses BM are shown. These balance masses BM are used to compensate for reaction forces resulting from actuation of the first support MT1 and/or second support MT2, and/or the third support MT3 of FIG. 7. As an alternative, or in addition thereto the mass of one or more of the first, second and third support MT1, MT2, MT3 may be used as a balance mass for compensation of reaction forces of the other of the first, second and third support MT1, MT2, MT3.

It is remarked that the use of a mass of one or more movable supports (for example stages constructed to hold a substrate or patterning device) in a system having multiple movable supports, (for example a multi-stage system of a lithographic apparatus) as a balance mass for the actuation of another of the supports of such system is not restricted to a lithographic apparatus constructed to selectively align first or second patterning device support with the projection system by movement of the first support and/or second support in a second direction perpendicular to the scanning direction.

This method to use the mass of one or more movable supports as a balance mass in a multi-support system, in particular in lithographic apparatus, may generally be applied.

In an alternative embodiment the patterning device support may be formed as a rotating support instead of a scanning support. In an embodiment, such a rotating patterning device support rotates which a constant velocity substantially perpendicular to the scanning direction which requires substantially less driving forces compared with a conventional patterning device support. In this embodiment, the patterning device support is formed as a rotating stage rotating around the z-axis with a constant velocity and holding a number of patterning devices. A short stroke may be used to compensate for the resulting arc due to such a rotating trajectory scan. As an alternative the wafer stage scan trajectory may be adapted to compensate for such an arc to obtain straight pattern lines on the substrate.

In a further alternative embodiment the patterning device support and the patterning device are replaced by a rotating drum that rotates around the x-axis with a constant velocity. In such a configuration a patterning device pattern is etched on the circumference of the rotating drum (e.g. the radius shape). Since such a patterning device pattern is curved with respect to the optical column, the resulting image error (e.g. focus errors) on the edges of the slit should be compensated for by e.g. a compensatory action in the optical column.

In an even further alternative embodiment, and to avoid such image errors, flat patterning devices may be mounted on the rotating drum. In such an embodiment multiple patterning devices are mounted on the rotating drum to illuminate a column of dies on the wafer. This embodiment may require a second rotating drum to avoid an offset, due to the changing angle of incidence in combination with the refractive index. To compensate for the relatively large volume requirement by using two separate drums, each comprising a separate axis of rotation, the drum holding the patterning devices may be formed as a hollow drum in which a solid drum is constructed and arranged and that also rotates to compensate for the offset. Such an embodiment has the benefit that there exists one mutual axis of rotation and consequently requires less volume. A configuration comprising four drums, wherein the two additional drums comprise mirrors, may be used in combination with reflective patterning devices (i.e. applicable in EUV-configurations).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

It will be appreciated that the different movements and/or positions of the supports and/or tables described herein can be controlled with one or more controllers (e.g. one controller for each support or one controller for all of the supports) that each may include one or more processors. For example, the one or more controllers can be configured to control the one or more actuators that are configured to move the one ore more supports. The one or more controllers can be part of the lithographic apparatus (e.g. part of a main controller of the lithographic apparatus). The one or more processors can be configured to execute machine executable instructions, which may be embedded in a data storage medium.

Software functionalities of a computer system involving programming, including executable codes, may be used to implement the above described embodiments. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as the main memory of a computer system. Physical transmission media include coaxial cables, copper wires and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system configured to condition a radiation beam;
a first support constructed to support a first patterning device and a second support constructed to support a second patterning device, the first patterning device and second patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the first support and second support are movable in a scanning direction over a scanning distance of at least a length of the first patterning device or second patterning device in the scanning direction,
wherein the first support and second support are movable in a second direction substantially perpendicular to the scanning direction over a distance of at least a width of the first patterning device or second patterning device in the second direction,
wherein the lithographic apparatus is constructed to selectively align the first support or second support with the projection system by movement of the first support and/or second support in the second direction,
wherein the first support and second support comprise a single actuator, a set of actuators or an actuator body or both a set of actuators and an actuator body to move the first support and the second support simultaneously in the second direction, and
wherein the first and second supports are independently movable from each other so that during movement of one of the first support and the second support in the scanning direction, the other one of the first support and the second support is movable in another direction that is different from the scanning direction.

2. The lithographic apparatus of claim 1, comprising a first actuator, a first set of actuators or a first actuator body or both a first set of actuators and a first actuator body to move the first support in the second direction and a second actuator, a second set of actuators or a second actuator body or both a second set of actuators and a second actuator body to move the second support in the second direction.

3. The lithographic apparatus of claim 1, wherein the lithographic apparatus is configured to project multiple dies arranged in a row or column in a single substrate table scanning movement.

4. The lithographic apparatus of claim 3, wherein the multiple dies are alternately projected by a projection beam having a pattern imparted by the first patterning device and second patterning device.

5. The lithographic apparatus of claim 1, wherein the lithographic apparatus is constructed to move, during a scanning movement of one of the first and second support, the other of the first and second support at least partially from an end position of a previous scanning movement to a start position of a new scanning movement.

6. The lithographic apparatus of claim 1, wherein the first support and the second support have a common balance mass.

7. The lithographic apparatus of claim 1, comprising one or more further supports each constructed to support a further patterning device, wherein the one or more further supports are movable in a scanning direction over a scanning distance of at least a length of a further patterning device in the scanning direction, and wherein the one or more further supports are movable in a second direction substantially perpendicular to the scanning direction over a second distance of at least a width of the further patterning device in the second direction, and wherein the lithographic apparatus is constructed to selectively align the first support, second support, or one of the one or more further supports with the projection system by movement of the first support, second support and/or one or more further supports in the second direction.

8. The lithographic apparatus of claim 7, wherein the first support, second support and one or more further supports subsequently follow/ a loop movement, comprising a scanning movement from a start position to an end position of the scanning movement, and a return movement from the end position to the start position of the scanning movement, wherein said return movement comprises the movement in the second direction.

9. The lithographic apparatus of claim 1, comprising a patterning device loading device configured to load and unload a patterning device on the first and/or second support, wherein the patterning device loading device is positioned such that loading/unloading of a patterning device on one of the first and second support is carried out when the other of the first and second support is aligned with the projection system to carry out a scanning movement.

10. The lithographic apparatus of claim 1, wherein a mass of one of the first support and the second support of the lithographic apparatus is used as a balance mass for the other one of the first support and the second support.

11. The lithographic apparatus of claim 1, wherein the movement of the other one of the first support and the second support in the other direction occurs without exposing the substrate with a pattern of the first or second patterning device supported by the other one of the first support and the second support during the movement.

12. The lithographic apparatus of claim 1, wherein the other direction is substantially perpendicular to the scanning direction.

13. A lithographic projection method using a lithographic apparatus comprising a first support supporting a first patterning device, a second support supporting a second patterning device, a projection system and a substrate table to support a substrate, the method comprising:

performing a substrate table scanning movement with the substrate table such that dies arranged in a row or column of the substrate supported on the substrate table are subsequently aligned with the projection system;

selectively aligning the first support and the second support with the projection system;

performing a scanning movement with the first or second support aligned with the projection system during the substrate table scanning movement to impart the radiation beam with a pattern in its cross section of the first patterning device or the second patterning device, respectively, and projecting the patterned radiation beam on the dies of the substrate subsequently aligned with the projection system, wherein the first and second supports are independently movable from each other so that during the scanning movement with one of the first support and the second support in the scanning direction, the other one of the first support and the second support is moved in another direction that is different from the scanning direction.

14. The method of claim 13, wherein selectively aligning the first patterning device and the second patterning device with the projection system comprises moving the first support and/or second support in a second direction substantially perpendicular to the scanning direction of the scanning movement over a second distance of at least a width of the first or second patterning device in the second direction.

15. The method of claim 13, wherein selectively aligning the first patterning device and the second patterning device with the projection system comprises alternately aligning the first patterning device and the second patterning device with the projection system.

16. The method of claim 13, wherein the first patterning device and the second patterning device have substantially the same pattern to project the subsequent dies with substantially same pattern or wherein the first patterning device and the second patterning device have different patterns to perform a double patterning process.

17. The method of claim 13, wherein the movement of the other one of the first support and the second support in the other direction occurs without exposing the substrate with a pattern of the first or second patterning device supported by the other one of the first support and the second support during the movement.

18. The method of claim 13, wherein the other direction is substantially perpendicular to the scanning direction.

* * * * *